(12) United States Patent
Lv

(10) Patent No.: US 12,730,139 B2
(45) Date of Patent: Sep. 8, 2026

(54) DETECTION APPARATUS AND TARGET DETECTION AND REPAIR SYSTEM

(71) Applicant: CONTEMPORARY AMPEREX TECHNOLOGY (HONG KONG) LIMITED, Hong Kong (CN)

(72) Inventor: Jianxian Lv, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 274 days.

(21) Appl. No.: 18/605,790

(22) Filed: Mar. 14, 2024

(65) Prior Publication Data

US 2024/0219444 A1 Jul. 4, 2024

Related U.S. Application Data

(63) Continuation of application No. PCT/CN2022/124617, filed on Oct. 11, 2022.

(30) Foreign Application Priority Data

Oct. 15, 2021 (CN) ........................ 202122495148.5

(51) Int. Cl.
*G01R 31/12* (2020.01)
*H01M 50/103* (2021.01)
(Continued)

(52) U.S. Cl.
CPC ...... *G01R 31/1263* (2013.01); *H01M 50/103* (2021.01); *H01M 50/119* (2021.01); *H01M 50/124* (2021.01); *H01M 50/131* (2021.01)

(58) Field of Classification Search
USPC ................................................ 118/712, 713
See application file for complete search history.

(56) References Cited

U.S. PATENT DOCUMENTS 9,689,825 B1 6/2017 Lim et al.
2011/0037666 A1 2/2011 Behrmann
2013/0328612 A1* 12/2013 Ofuji .................... G11C 19/28 327/408

FOREIGN PATENT DOCUMENTS

CN 103090779 A 5/2013
CN 104792255 A 7/2015
(Continued)

OTHER PUBLICATIONS

The World Intellectual Property Organization (WIPO) International Search Report for PCT/CN2022/124617 Jan. 18, 2023 8 Pages (including translation).
(Continued)

*Primary Examiner* — Yewebdar T Tadesse
(74) *Attorney, Agent, or Firm* — Anova Law Group, PLLC

(57) ABSTRACT

A detection apparatus includes a conductive film having N film regions, where the conductive film is used to fit with an insulating layer of a target, and the target includes a metal layer, the insulating layer covering the metal layer; a signal generator configured to transmit a first electromagnetic signal to the conductive film; and a signal receiver including N collecting units, where the n-th film region corresponds to the n-th collecting unit, and the signal receiver is configured to obtain the n-th collecting signal. The collecting signal is used to determine whether there is a predetermined defect in a region of the insulating layer covered by the n-th film region; and position information of the n-th film region is used to determine position information of the predetermined defect on the insulating layer.

14 Claims, 6 Drawing Sheets

(51) Int. Cl.

| | |
|---|---|
| ***H01M 50/119*** | (2021.01) |
| ***H01M 50/124*** | (2021.01) |
| ***H01M 50/131*** | (2021.01) |

(56) References Cited

FOREIGN PATENT DOCUMENTS

| | | | |
|---|---|---|---|
| CN | 205643250 | U | 10/2016 |
| CN | 206348280 | U | 7/2017 |
| CN | 107422029 | A | 12/2017 |
| CN | 104792255 | B | 6/2018 |
| CN | 110220919 | A | 9/2019 |
| CN | 112326782 | A | 2/2021 |
| CN | 216484770 | U | 5/2022 |
| EP | 590524 | A1 * | 4/1994 |
| JP | 2005142521 | A | 6/2005 |
| KR | 100632534 | B1 | 10/2006 |
| WO | 2006031813 | A2 | 3/2006 |

OTHER PUBLICATIONS

The European Patent Office (EPO) The Extended European Search Report for Application No. 22880298.9 Nov. 6, 2024 6 Pages.

* cited by examiner

DETECTION APPARATUS AND TARGET DETECTION AND REPAIR SYSTEM

CROSS-REFERENCE TO RELATED APPLICATIONS

This application is a continuation of International Application No. PCT/CN2022/124617, filed on Oct. 11, 2022, which claims priority to Chinese Utility Model application Ser. No. 202122495148.5, filed with the China National Intellectual Property Administration on Oct. 15, 2021 and entitled "DETECTION APPARATUS AND TARGET DETECTION AND REPAIR SYSTEM", the entire contents of both which are incorporated herein by reference.

TECHNICAL FIELD

This application relates to the field of detection technologies, and specifically, to a detection apparatus and a target detection and repair system.

BACKGROUND

A cell has an insulating layer on the surface, and the safety of the cell can be ensured only when the insulating layer is sufficiently insulating and voltage resistant. As such, even tiny defects on the insulating layer may lead to failure in the insulation performance and voltage resistance of the insulating layer. However, it is difficult to detect the tiny defects by naked eyes of production line workers and charge-coupled device (charge coupled device, CCD) cameras.

SUMMARY

One objective of embodiments of this application is to provide a detection apparatus and a target detection and repair system, so as to at least simplify detection of tiny defects on an insulating layer and accurately locate defect positions on the insulating layer.

The technical solutions used in the embodiments of this application are as follows.

According to a first aspect, a detection apparatus is provided, including:

- a conductive film having N film regions, where any two of the film regions are insulated from each other, the conductive film is used to fit with an insulating layer of a target, and the target includes a metal layer, the insulating layer covering the metal layer;
- a signal generator configured to transmit a first electromagnetic signal to the conductive film; and
- a signal receiver including N collecting units, where the n-th film region corresponds to the n-th collecting unit, and the signal receiver is configured to obtain the n-th collecting signal from a second electromagnetic signal generated after the first electromagnetic signal undergoes actions of the conductive film, the insulating layer, and the metal layer; where n is a positive integer less than or equal to N;
- where the collecting signal is used to determine whether there is a predetermined defect in a region of the insulating layer covered by the n-th film region; and position information of the n-th film region is used to determine position information of the predetermined defect on the insulating layer.

The beneficial effect of the detection apparatus provided in the embodiments of this application is as follows: the conductive film is divided into N film regions; and the film region covers the insulating layer of the target and is coupled to a metal housing corresponding to the film region. If there is a predetermined defect on the insulating layer, a capacitance value formed by the coupling between the metal housing and the corresponding film region will be changed, thereby resulting in change in the collecting signal generated by the collecting unit. In this way, any tiny defect on the insulating layer of the target can be easily detected by the detection apparatus. In addition, the position on the target where the predetermined defect is located can be located based on the position information of the film region, so as to locate the predetermined defect while detecting the predetermined defect.

In an embodiment, the detection apparatus further includes a processing unit, where the processing unit is connected to the signal receiver, and the processing unit is configured to determine, based on the n-th collecting signal, whether there is the predetermined defect in the region of the insulating layer covered by the n-th film region.

In an embodiment, the processing unit is specifically configured to determine, based on the n-th collecting signal, thickness of the region of the insulating layer covered by the n-th film region and determine whether the thickness is within a predetermined thickness range; and when the thickness is outside the predetermined thickness range, determine that there is the predetermined defect in the region of the insulating layer covered by the n-th film region; or when the thickness is within the predetermined thickness range, determine that there is no predetermined defect in the region of the insulating layer covered by the n-th film region.

In an embodiment, the processing unit is specifically configured to compare the n-th collecting signal with a predetermined signal; and when a difference between the n-th collecting signal and the predetermined signal is within a predetermined difference range, determine that there is no predetermined defect in the region of the insulating layer covered by the n-th film region; or when a difference between the n-th collecting signal and the predetermined signal is outside a predetermined difference range, determine that there is the predetermined defect in the region of the insulating layer covered by the n-th film region.

In an embodiment, the detection apparatus further includes a communication unit configured to output the position information of the n-th film region as the position information of the predetermined defect on the insulating layer when the processing unit determines that there is the predetermined defect in the region of the insulating layer covered by the n-th film region.

In an embodiment, the detection apparatus further includes a pressing plate, where the conductive film is disposed on the pressing plate.

In an embodiment, the n-th collecting unit is located between the pressing plate and the n-th film region.

In an embodiment, the n-th collecting unit is located on the n-th film region and electrically isolated from the n-th film region.

In an embodiment, the pressing plate has an alignment mechanism, where the alignment mechanism is configured to align the conductive film with a predetermined position of the target.

In an embodiment, the alignment mechanism includes alignment markers located on the pressing plate, where the alignment markers are used to align with the predetermined position of the target; or

- the alignment mechanism includes a backing plate located on the pressing plate, where the backing plate is located on a side surface of the conductive film, and the backing plate is configured to rest against the predetermined position of the target.

In an embodiment, the signal generator is a common signal generator, where the common signal generator is configured to transmit the first electromagnetic signal to the N film regions; or the n-th film region corresponds to the n-th signal generator, where the n-th signal generator is configured to transmit the first electromagnetic signal to the n-th film region.

In an embodiment, the target includes a cell housing or a battery housing, where the cell housing or the battery housing includes a metal housing and an insulating layer covering a surface of the metal housing.

According to a second aspect, a target detection and repair system is provided, including:

the detection apparatus according to any one of the foregoing technical solutions; and a repair apparatus connected to the detection apparatus, where the repair apparatus is configured to receive the position information of the predetermined defect on the insulating layer of the target output by the detection apparatus, and eliminate the predetermined defect based on the position information.

The beneficial effect of the target detection and repair system provided in the embodiments of this application is as follows: the detection apparatus provided in the foregoing embodiments is first used to detect whether there is a predetermined defect on the insulating layer of the target, and if there is a predetermined defect, the position information of the predetermined defect is further determined based on the position information of the film region in which the predetermined defect is detected, so as to locate the predetermined defect while implementing easy detection of the predetermined defect.

In an embodiment, the repair apparatus includes a dispensing apparatus, where the dispensing apparatus is configured to patch the insulating layer with adhesive based on the position information of the predetermined defect.

BRIEF DESCRIPTION OF DRAWINGS

To describe the technical solutions in the embodiments of this application more clearly, the following briefly describes the accompanying drawings required for describing the embodiments or illustrative techniques. Apparently, the accompanying drawings in the following description show only some embodiments of this application, and persons of ordinary skill in the art may still derive other drawings from these accompanying drawings without creative efforts.

DESCRIPTION OF REFERENCE SIGNS

10. detection apparatus; 11. conductive film; 111. film region; 12. signal generator; 13. signal receiver; 131. collecting unit; 14. processing unit; 15. pressing plate; 16. communication unit; 17. alignment mechanism;

20. repair apparatus; 21. dispensing apparatus; 22. information processing apparatus;

31. metal layer; 32. insulating layer; and 33. predetermined defect.

DESCRIPTION OF EMBODIMENTS

To make the objectives, technical solutions, and advantages of this application more comprehensible, the following further describes this application in detail with reference to the accompanying drawings and embodiments. It should be understood that the specific embodiments described herein are merely used to explain this application but are not intended to limit this application.

It should be noted that when a component is referred to as being "fastened to" or "disposed on" another component, it may be directly on the another component or indirectly on the another component. When a component is referred to as being "connected to" another component, it may be directly or indirectly connected to the another component. The orientations or positional relationships indicated by the terms "upper", "lower", "left", "right", and the like are based on the orientations or positional relationships shown in the accompanying drawings. These terms are merely for ease of description rather than indicating or implying that the apparatuses or elements mentioned must have specific orientations or must be constructed or manipulated according to specific orientations, and therefore shall not be construed as any limitations on this application. Persons of ordinary skills in the art can understand specific meanings of these terms as appropriate to specific situations. The terms "first" and "second" are merely intended for a purpose of ease of description, and shall not be understood as an indication or implication of relative importance or an implicit indication of the number of the technical features. "A plurality of" means two or more, unless otherwise specifically defined.

The following describes in detail the technical solutions provided in this application with reference to the specific accompanying drawings and embodiments.

Figure 1:
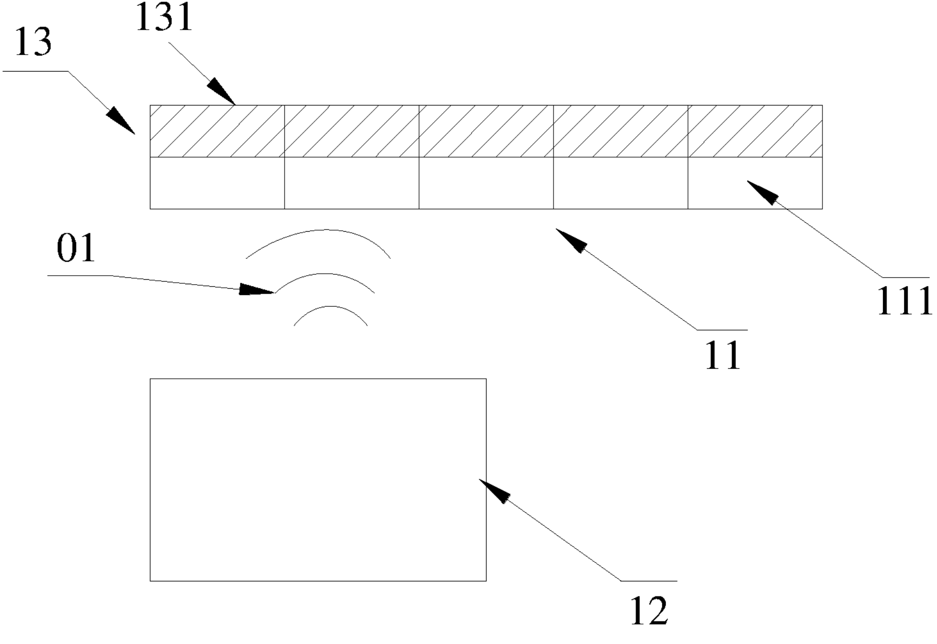
FIG. 1 is a schematic structural diagram of a detection apparatus according to an embodiment of this application.
Figure 2:
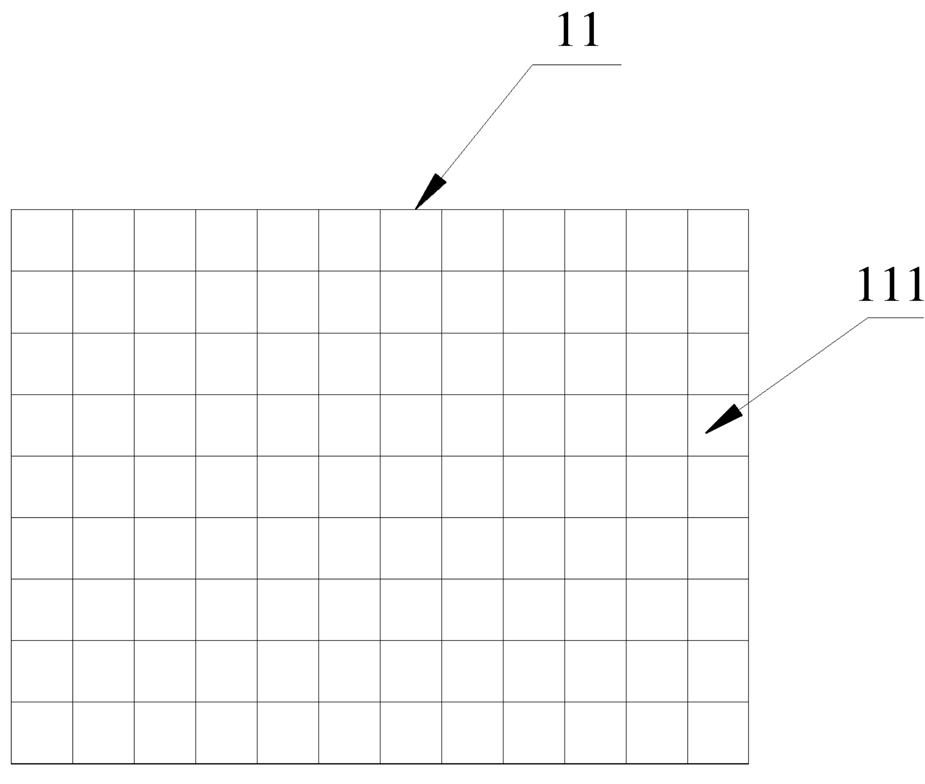
FIG. 2 is a schematic structural diagram of a conductive film according to an embodiment of this application.
Figure 3:
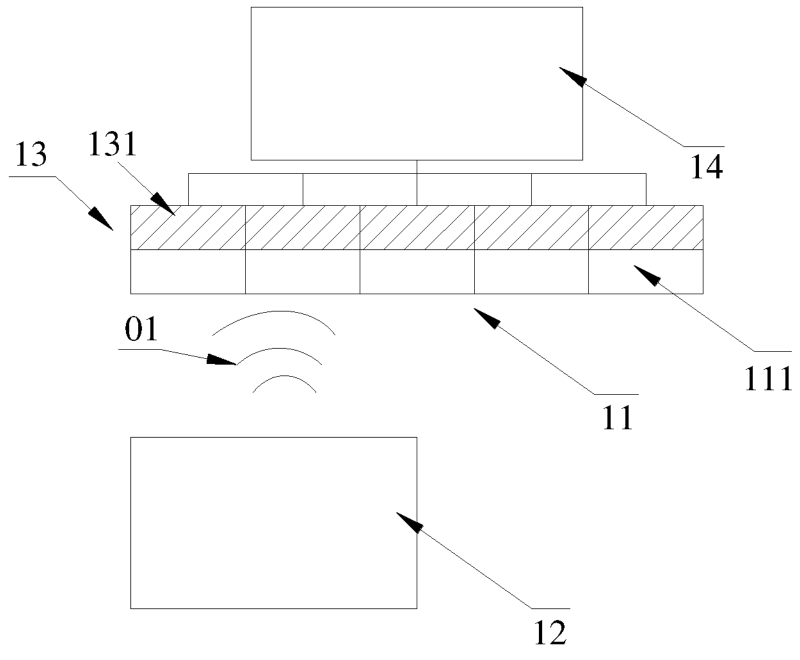
FIG. 3 is a schematic structural diagram of a detection apparatus according to an embodiment of this application.

As shown in FIG. 1 to FIG. 3, some embodiments of this application provide a detection apparatus 10 including a conductive film 11, a signal generator 12, and a signal receiver 13. The conductive film 11 has N film regions 111, where any two of the film regions 111 are insulated from each other, the conductive film 11 is used to fit with an insulating layer 32 of a target, and the target includes a metal layer 31, the insulating layer 32 covering the metal layer 31. The signal generator 12 is configured to transmit a first electromagnetic signal 01 to the conductive film 11. The signal receiver 13 includes N collecting units 131, where the n-th film region 111 corresponds to the n-th collecting unit 131, and the collecting unit 131 is configured to obtain the n-th collecting signal from a second electromagnetic signal generated after the first electromagnetic signal 01 undergoes actions of the conductive film 11, the insulating layer 32, and the metal layer 31; where n is a positive integer less than or equal to N. The collecting signal is used to determine whether there is a predetermined defect 33 in a region of the insulating layer 32 covered by the n-th film region 111. Position information of the n-th film region 111 is configured to determine position information of the predetermined defect 33 on the insulating layer 32.

The position information of the n-th film region 111 may include coordinates of the n-th film region 111. For example, the coordinates of the n-th film region 111 may be a row number and a column number or a number of the n-th film region 111 in a rectangular array formed by the N film regions 111.

The conductive film 11 may be a piezoelectric film, and the piezoelectric film may be a piezoelectricpolyvinylidene fluoride(Polyvinylidene fluoride, PVDF)polymer film. The piezoelectric film is a conductor material that can generate a corresponding response to eddy currents generated by the first electromagnetic signal 01.

In some embodiments, the first electromagnetic signal may be a high-frequency electromagnetic signal.

The conductive film 11 in these embodiments of this application is a very thin conductive film.

Figure 5:
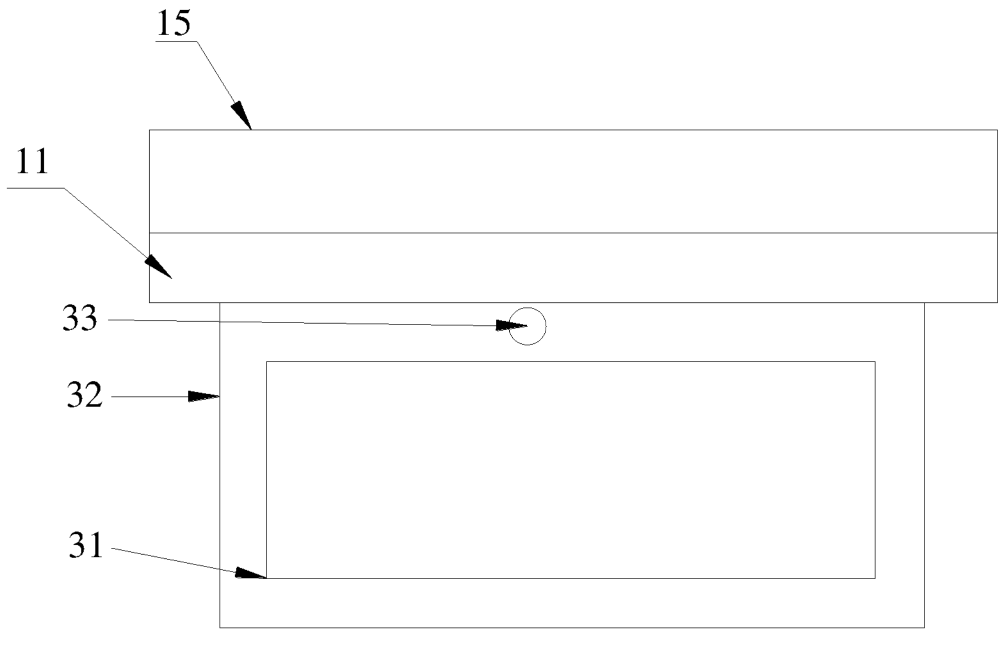
FIG. 5 is a schematic structural diagram of a detection apparatus being attached to a target according to an embodiment of this application.
Figure 6:
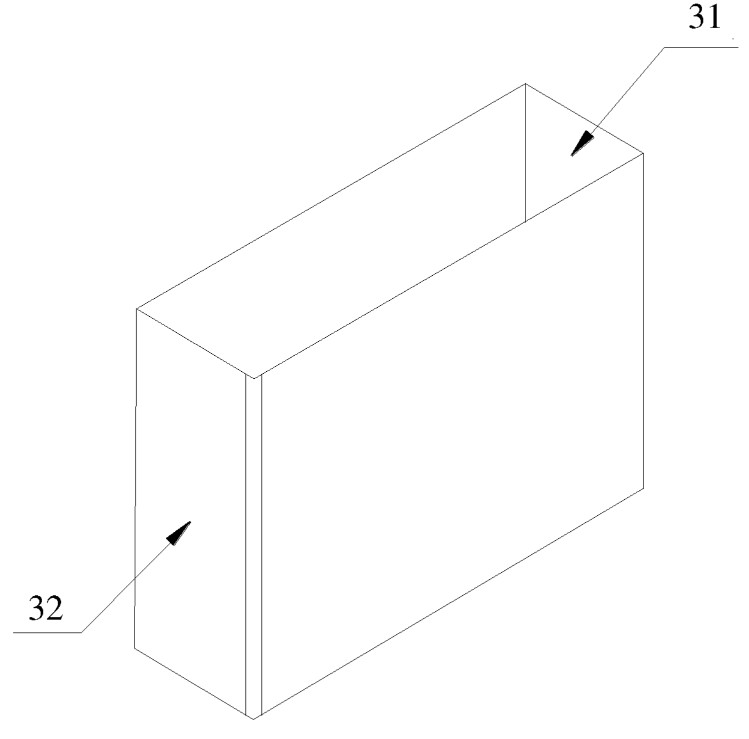
FIG. 6 is a schematic structural diagram of a target according to an embodiment of this application.

The target may include a metal layer 31 and an insulating layer 32 covering the metal layer 31. The conductive film 11 is used to fit with the insulating layer 32 of the target. Referring to FIG. 5 and FIG. 6, the target may include a metal layer 31 and an insulating layer 32 covering an outer surface of the metal layer 31. There may be a predetermined defect 33 in the insulating layer 32 of the target.

The target includes but is not limited to a cell housing and/or a battery housing. A body portion of the cell housing and/or the battery housing may be the metal layer 31, for example, the body portion of the cell housing and/or the battery housing may be an aluminum shell. The insulating layer 32 provided on the metal layer 31 may include an insulating coating sprayed on the surface of the metal layer 31 by spraying or an insulating film covering the surface of the metal housing.

The cell housing may be a cell housing of a traction battery, and the battery housing may be a battery housing of a traction battery. The traction battery may be a lithium battery and/or a sodium battery, or the like.

The signal generator 12 may include an alternating current power supply and an excitation coil connected to the alternating current power supply. The alternating current power supply provides an alternating current with a frequency greater than a certain frequency threshold to the excitation coil, and the excitation coil generates a high-frequency alternating magnetic field under the action of the high-frequency alternating current.

The signal generator 12 maybe separated from or integrated with the conductive film 11.

The collecting unit 131 may include a receiving circuit, and the signal receiver 13 can sense the high-frequency alternating magnetic field to generate the collecting signal. The receiving circuit includes but is not limited to a receiving coil.

In the embodiments of this disclosure, the conductive film 11 is divided into N film regions 111, with any two of the film regions 111 being insulated and isolated. These N film regions 111 may be distributed in a rectangular array.

For example, any two of the N film regions 111 may have the same shape and area. For example, the conductive film 11 maybe divided into the N film regions 111 by a standard rectangular grid.

For example, an area of one film region 111 may be a predetermined area. For example, the predetermined area may be 0.5 centimeters (cm)*0.5 cm or 1 cm*1 cm. Certainly, this is merely an example of the predetermined area, and the specific implementation is not limited to this example.

One film region 111 is connected to one collecting unit 131, and one film region 111 is coupled to a corresponding position region of the metal layer 31 of the target to form a capacitor. Uneven thickness or the presence of defects of the insulating layer 32 located between the metal layer 31 and the film region 111 affects a capacitance value of the capacitor formed by the coupling between the film region 111 and the metal layer 31. In this way, when the high-frequency alternating magnetic field passes through capacitors with different capacitance values, a signal value of the first electromagnetic signal 01 is changed, so a collecting circuit will collect different first electromagnetic signals 01, thereby inductively generating collecting signals with different signal characteristics. The signal characteristic includes but is not limited to amplitude and/or phase of the first electromagnetic signal 01.

In view of this, based on the signal characteristic of the collecting signal of the n-th collecting unit 131 corresponding to the n-th film region 111, it can be determined whether there is the predetermined defect 33 in the region of the insulating layer 32 covered by the n-th film region 111.

The collecting signal may be a current signal formed by the collecting unit 131 sensing the first electromagnetic signal 01 that undergoes the joint action of the target and the film region 111. The signal characteristic includes but is not limited to amplitude, phase, and/or frequency of the current signal.

The predetermined defect 33 includes but is not limited to at least one of the following:

- thickness of the insulating layer 32 is less than a required thickness;
- the insulating layer 32 has bubbles inside;
- surface of the insulating layer 32 has depressions or air holes; and
- surface of the insulating layer 32 has breakages.

Each of the foregoing predetermined defects 33 on the insulating layer 32 affects the thickness of the insulating layer 32 between the n-th film region 111 and the metal layer 31 and/or the arrangement form of the insulating layer 32, thereby affecting the capacitance value between the n-th film region 111 and the metal layer 31. The magnitude of the capacitance value can be reflected by the signal characteristic of the collecting signal of the collecting unit 131. Therefore, based on this principle, the predetermined defect 33 on the insulating layer 32 can be easily detected. For example, defects such as tiny air holes on the insulating layer 32 and even bubbles inside the insulating layer 32 can be all detected, thereby achieving easy detection of defects on the insulating layer 32. In addition, because any one of the N film regions 111 has its predetermined position, the position of the predetermined defect 33 on the insulating layer 32 can be located based on the position of the n-th film region 111, so as to not only detect the predetermined defect 33 on the insulating layer 32, but also locate the predetermined defect 33 on the insulating layer 32.

Figure 4:
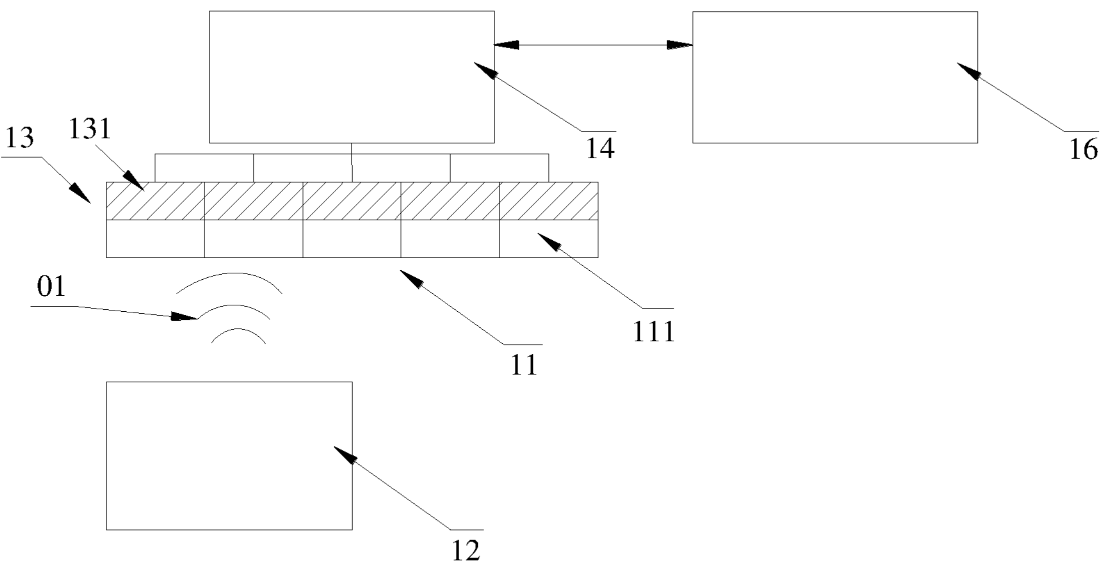
FIG. 4 is a schematic structural diagram of a detection apparatus according to an embodiment of this application.

In an embodiment, as shown in FIG. 3 and FIG. 4, the detection apparatus 10 further includes a processing unit 14.

The processing unit 14 is connected to the signal receiver 13, and the processing unit 14 is configured to determine, based on the n-th collecting signal, whether there is the predetermined defect 33 in the region of the insulating layer 32 covered by the n-th film region 111.

In an embodiment, the processing unit 14 may include various structures with information processing capability. For example, the processing unit 14 may include but is not limited to a central processing unit (CPU), a microprocessor (MCU), an embedded controller, or an application-specific integrated circuit.

In another embodiment, the processing unit 14 may alternatively be an upper computer connected to the collecting unit 131. The upper computer includes but is not limited to an electronic device such as a personal computer (PC).

In still another embodiment, the processing unit 14 may have a comparison circuit. The comparison circuit is configured to perform corresponding comparison based on the n-th collecting signal collected, and determine whether there is the predetermined defect 33 in the region of the insulating layer 32 covered by the n-th film region 111 based on the comparison result. For example, one input terminal of the comparison circuit may be connected to an output terminal of the collecting unit 131, and the other input terminal of the comparison circuit may be connected to a reference current source or a reference voltage source. The reference current source and/or the reference voltage source may provide a predetermined signal corresponding to the insulating layer 32 with no predetermined defect 33.

The processing unit 14 maybe connected to all of the collecting units 131, and is configured to determine, based on the n-th collecting signal, whether there is the predetermined defect 33 in the region of the insulating layer 32 covered by the n-th film region 111 corresponding to the n-th collecting unit 131.

Through the introduction of the processing unit 14, the detection apparatus 10 itself can quickly determine whether there is the predetermined defect 33 in the region of the insulating layer 32 covered by the corresponding film region 111 and locate the specific position of the predetermined defect 33.

In some embodiments, the processing unit 14 is specifically configured to determine, based on the n-th collecting signal, thickness of the region of the insulating layer 32 covered by the n-th film region 111 and determine whether the thickness is within a predetermined thickness range; and when the thickness is outside the predetermined thickness range, determine that there is the predetermined defect 33 in the region of the insulating layer 32 covered by the n-th film region 111; or when the thickness is within the predetermined thickness range, determine that there is no predetermined defect 33 in the region of the insulating layer 32 covered by the n-th film region 111.

For example, the processing unit 14 knows in advance a thickness range of the insulating layer 32 with no predetermined defect 33, and then obtains the thickness of the region of the insulating layer 32 covered by the n-th film region 111 based on a mapping relationship between the signal characteristic of the n-th collecting signal actually collected and the thickness of the insulating layer 32 as well as the signal characteristic of the n-th collecting signal actually collected. Then, the processing unit 14 compares to determine whether the calculated thickness is within the predetermined thickness range, thereby determining whether there is the predetermined defect 33 in the region of the insulating layer 32 covered by the n-th film region 111.

In some embodiments, the processing unit 14 is specifically configured to compare the n-th collecting signal with a predetermined signal; and when a difference between the n-th collecting signal and the predetermined signal is within a predetermined difference range, determine that there is no predetermined defect 33 in the region of the insulating layer 32 covered by the n-th film region 111; or when a difference between the n-th collecting signal and the predetermined signal is outside a predetermined difference range, determine that there is the predetermined defect 33 in the region of the insulating layer 32 covered by the n-th film region 111.

The processing unit 14 may know in advance a signal characteristic collected when a corresponding region of the insulating layer 32 has no predetermined defect 33. Subsequently, when the n-th collecting signal is actually collected, the processing unit 14 can determine whether a difference between the actual signal characteristic of the n-th collecting signal and the predetermined signal characteristic is within the predetermined difference range, thereby determining whether there is the predetermined defect 33 in the region of the insulating layer 32 covered by the n-th film region 111.

Directly comparing to determine based on the signal characteristic can also quickly determine whether there is the predetermined defect 33 in the region of the insulating layer 32 covered by each film region 111.

In some embodiments, as shown in FIG. 4, the detection apparatus 10 further includes a communication unit 16 configured to output the position information of the n-th film region 111 as the position information of the predetermined defect 33 on the insulating layer 32 when the processing unit 14 determines that there is the predetermined defect 33 in the region of the insulating layer 32 covered by the n-th film region 111.

The communication unit 16 maybe a wired communication unit or a wireless communication unit. If the communication unit 16 is a wired communication unit, the communication unit 16 may include a wired network interface and the like, and can be configured to output the information of the position of the predetermined defect 33 on the insulating layer 32 to an external device.

If the communication unit 16 is a wireless communication unit, the communication unit 16 may include a transceiver antenna, and can output the information of the position of the predetermined defect 33 on the insulating layer 32 to an external device via the transceiver antenna. If the communication unit 16 is a wireless communication unit, the communication unit 16 may include but is not limited to a Bluetooth communication unit, an infrared communication unit, an ultra-wideband (Ultra Wide Band, UWB) communication unit, or a WiFi communication unit.

The position information of the predetermined defect 33 specifically output can be directly determined based on the position information of the film region 111 where the predetermined defect 33 is detected.

In some embodiments, as shown in FIG. 5, the detection apparatus 10 further includes a pressing plate 15, where the conductive film 11 is disposed on the pressing plate 15.

The pressing plate 15 maybe an insulating plate having a certain weight. Through its weight, the pressing plate 15 can allow the conductive film 11 to tightly press the insulating layer 32 of the target, thereby reducing a gap between the conductive film 11 and the insulating layer 32. In addition, the pressing plate 15 can be used as a supporting substrate for the conductive film 11.

In some embodiments, the pressing plate 15 maybe a macromolecular plastic plate having sufficient strength and a certain weight.

The n-th collecting unit 131 is located between the pressing plate 15 and the n-th film region 111.

The collecting unit 131 may include a collecting circuit, the collecting circuit is located between the n-th film region 111 and the pressing plate 15, and a surface of the n-th film region 111 with no collecting unit 131 disposed can fit well with the insulating layer 32 of the target.

In an embodiment, an insulating isolation band is present between the n-th collecting unit 131 and the n-th film region 111. The insulating isolation band is the structure of the foregoing electrical isolation.

Figure 7:
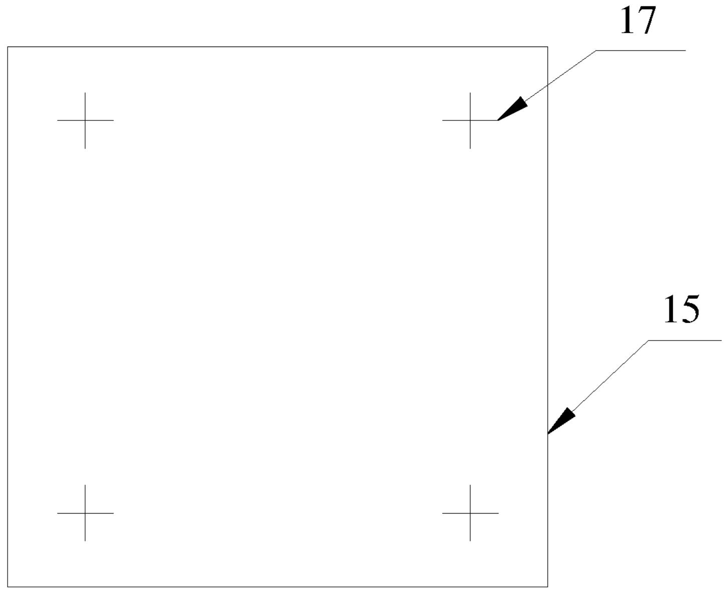
FIG. 7 is a schematic structural diagram of a pressing plate according to an embodiment of this application.

In an embodiment, as shown in FIG. 7, the pressing plate 15 has an alignment mechanism 17, where the alignment mechanism 17 is configured to align the conductive film 11 with a predetermined position of the target.

The alignment mechanism 17 can be configured to align the detection apparatus 10 with the target, so that the position information of the film region 111 can be considered as the position information of the defect.

In some embodiments, the alignment mechanism 17 includes alignment markers located on the pressing plate 15. The alignment markers are used to align with the predetermined position of the target. FIG. 7 shows one type of alignment markers located on the alignment mechanism 17.

For example, the alignment markers may be scales or indentations or coating markers located on the pressing plate 15. The markers may align with the predetermined position of the target. The predetermined position may be a specific position of the target, for example, the left apex of the cell housing. The predetermined position may alternatively be a position on the target where one or more alignment markers are located.

The introduction of the alignment markers can ensure that the position of the predetermined defect 33 is easily located directly based on the position information of the film region 111.

In some embodiments, the alignment mechanism 17 may include a backing plate located on the pressing plate 15. The backing plate is located on a side surface of the conductive film 11, and the backing plate is configured to rest against the predetermined position of the target.

The backing plate can be configured to bring the predetermined position of the target closer, thereby aligning the conductive film 11 with the target.

In some embodiments, the signal generator 12 is a common signal generator, where the common signal generator is configured to transmit the first electromagnetic signal 01 to the N film regions 111;

or the n-th film region 111 corresponds to the n-th signal generator 12, where the n-th signal generator 12 is configured to transmit the first electromagnetic signal 01 to the n-th film region 111.

The signal generator 12 maybe a structure separated from the collecting unit 131 and may transmit the first electromagnetic signal 01 to the region where the conductive film 11 is located.

In an embodiment, all of the film regions 111 may share one signal generator 12. This shared signal generator 12 is the common signal generator 12, and all of the film regions 111 have one signal generator 12, thus featuring a simple structure.

In another embodiment, one film region 111 corresponds to one signal generator 12, so this signal generator 12 transmits the first electromagnetic signal 01 to only the corresponding film region 111. Therefore, detection of the insulating layer 32 in each region can be individually controlled.

In some embodiments, referring to FIG. 5 and FIG. 6, the target includes a cell housing or a battery housing. The cell housing or the battery housing includes a metal housing and the insulating layer 32 covering a surface of the metal housing. The metal housing forms the metal layer 31 of the target.

The metal housing herein includes but is not limited to an aluminum shell. The insulating layer 32 includes but is not limited to a sprayed insulating layer 32, an electroplated insulating layer 32, or an insulating film covering the surface of the metal housing.

The cell housing may be a cell housing of a primary battery or a secondary battery; and the battery housing may be a battery housing of a primary battery or a secondary battery.

Figure 8:
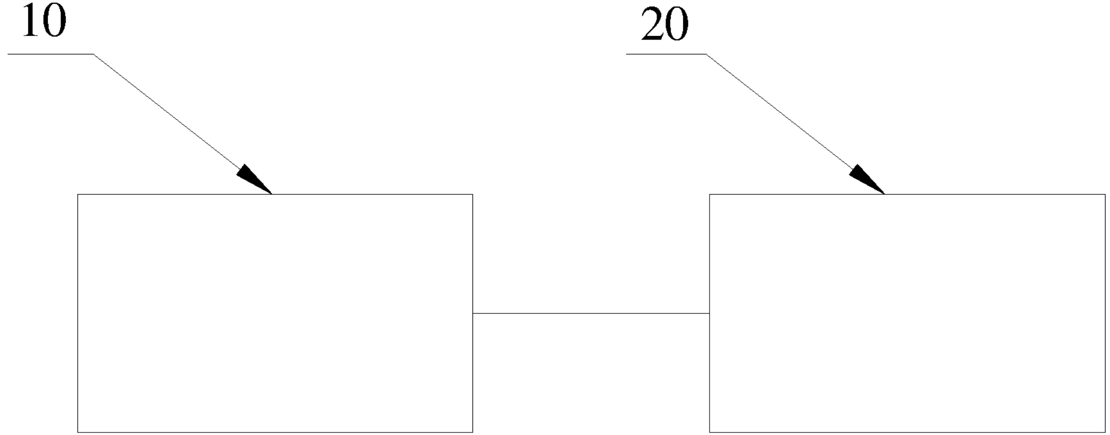
FIG. 8 is a schematic structural diagram of a target detection and repair system according to an embodiment of this application.

As shown in FIG. 8, an embodiment of this application provides a target detection and repair system including a repair apparatus 20 and the detection apparatus 10 according to any one of the foregoing technical solutions. The repair apparatus 20 is connected to the detection apparatus 10, where the repair apparatus 20 is configured to receive the position information of the predetermined defect 33 on the insulating layer 32 of the cell housing output by the detection apparatus 10, and eliminate the predetermined defect 33 based on the position information.

If the predetermined defect 33 is detected, the detection apparatus 10 sends the position information of the predetermined defect 33 to the repair apparatus 20 when detecting that there is the predetermined defect 33 on the insulating layer 32 of the target. In this way, the repair apparatus 20 repairs the predetermined defect 33 in a targeted manner based on the position information, thereby achieving detection and repair of the insulating layer 32 of the target.

Figure 9:
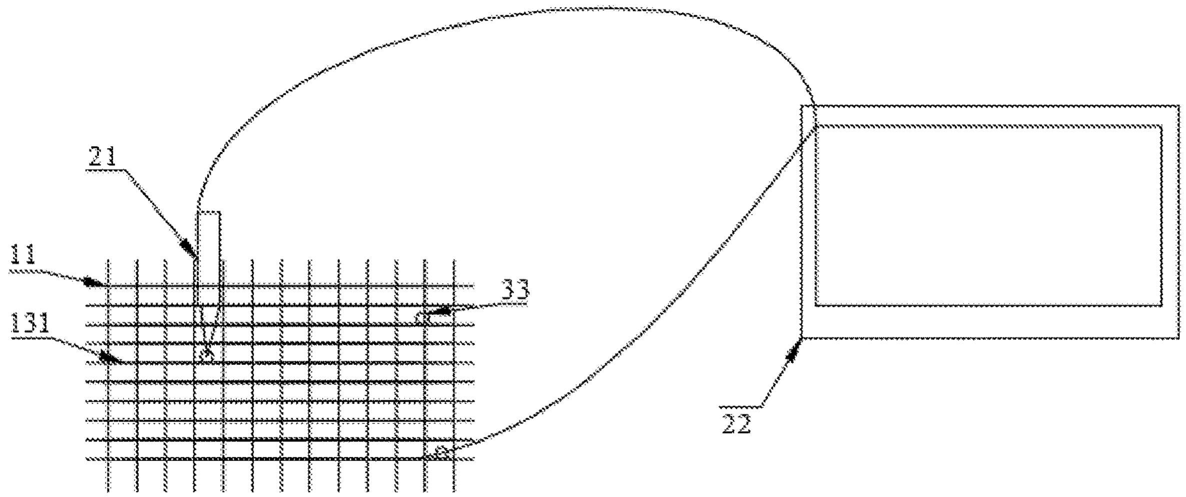
FIG. 9 is a schematic structural diagram of a target detection and repair system according to an embodiment of this application.

In some embodiments, as shown in FIG. 9, the repair apparatus 20 includes a dispensing apparatus 21, where the dispensing apparatus 21 is configured to patch the insulating layer 32 with adhesive based on the position information of the predetermined defect 33.

The dispensing apparatus 21 may include a dispensing head, and can solve the problems of insufficient thickness or depressions or breakages of the insulating layer 32 of the target by dispensing.

The dispensing head of the dispensing apparatus 21 is loaded with an insulating adhesive having a certain fluidity. After the position information of the predetermined defect 33 is received, the dispensing head moves to the corresponding position to extrude the adhesive, and then the adhesive is cured to complete the repair of the predetermined defect 33.

The dispensing apparatus 21 maybe connected to an information processing apparatus 22. The information processing apparatus 22 can repair the predetermined defect 33 by dispensing based on the position information provided by the detection apparatus 10.

In some embodiments, the detection apparatus 10 is further configured to detect again the target that has been repaired by the repair apparatus 20, so as to determine whether the predetermined defect 33 is repaired successfully.

Through the principle of detecting the thickness difference of the insulating layer 32 on the battery surface and determining the tiny defects on the surface when the difference is lower than a threshold, and through the scheme of simultaneous detection of multiple positions in multiple regions, the positions and number of failures on the insulating layer 32 on the battery surface can be quickly and effectively detected, making it convenient for subsequent reworking processes for the tiny defect positions.

In addition to the tiny defects on the surface, the defects on the insulating layer 32 on the battery surface further include tiny defects within the film such as bubbles and burrs that are difficult for employees and CCD detection to detect but can be detected by the detection apparatus 10 provided in the embodiments of this application.

An embodiment of this application provides an apparatus for quickly detecting surface defects on an insulating film on a battery surface in multiple regions, including a planar pressing plate, a collecting unit 131, and an information processing apparatus 22.

The collecting unit 131 is attached with a piezoelectric film, and different regions of the piezoelectric film have a plurality of independent collecting circuits. The piezoelectric film is one of the foregoing conductive films 11.

The collecting circuits on the piezoelectric film are arranged at fixed positions to directly feed back the position information of the defects after the defects are determined.

With the requirement for the film thickness and the threshold requirement for the film thickness difference input, a difference between the collected film thickness of the insulating film on the battery surface and the required film thickness is calculated. The device compares the difference with the threshold requirement for the film thickness difference, and automatically determines whether there is the surface defect at the position. The collecting positions on the piezoelectric film correspond to different regions on the information processing interface, which can directly locate the surface defect position and can simultaneously locate a plurality of predetermined defects 33, making it convenient for reworking operations.

The current signal between the piezoelectric film and the surface of the workpiece can be collected and converted into the film thickness difference.

During assembly of the battery, the insulating layer 32 is broken due to internal and external causes, and the insulating layer 32 becomes thinner due to breakages of the insulating layer 32 or internal bubbles, which causes a flat plate workpiece covered by the piezoelectric film to come into tight contact with the insulating film of the cell. Through the independent collecting unit 131 on the piezoelectric film in FIG. 9, the collected electrical signal is converted into the film thickness which is compared with the pre-input required film thickness value to calculate the film thickness difference. If the film thickness difference is lower than the pre-input film thickness difference threshold, the system determines that the predetermined defect 33 is present, and can locate the position of the predetermined defect 33 through the arrangement positions of the collecting units 131 in FIG. 9, making it convenient for automatic dispensing and reworking.

Referring to FIG. 9, the flat plate workpiece is tightly pressed against the insulating layer 32 on the cell surface. With a flat plate indenter pressed against the conductive film 11, the conductive film 11 generates eddy currents in a metal conductor located below the flat plate indenter based on a high-frequency electromagnetic field. The amplitude and phase of the eddy currents are a function of the thickness of the insulating layer 32 between the conductor and the conductive film 11. In other words, an alternating electromagnetic field generated by the eddy currents changes probe parameters.

The collecting unit 131 collects the eddy currents to obtain the collecting signal, and signal parameters (that are, signal characteristics) of the collecting signal are input to the information processing apparatus 22. The information processing apparatus 22 calculates the thickness of the insulating layer 32 based on the signal characteristic of the collecting signal, calculates a film thickness difference of the insulating layer 32 collected by each collecting unit 131 through the pre-input required film thickness value and film thickness difference threshold, and determines whether there is the predetermined defect 33 by comparing the calculated film thickness difference with the film thickness difference threshold.

The flat plate workpiece can press the conductive film 11 against the outer surface of the cell housing through the pressing plate 15.

In the information processing apparatus 22, after it is determined that there is the predetermined defect 33 on the insulating layer 32, coordinates of the film region 111 where the predetermined defect 33 is located are output, making it convenient for the repair apparatus 20 such as an automatic dispensing device to automatically patch with adhesive and perform reworking to eliminate the predetermined defect 33.

The automatic dispensing device may be integrated in the information processing apparatus 22. After feeding back the coordinates, the collecting unit 131 synchronously feeds back and gives a dispensing signal to the dispensing device, and the dispensing device automatically patches with adhesive and performs reworking.

The collecting unit 131 may be present independently on the piezoelectric film, and can simultaneously detect predetermined defects 33 at different positions, which prevents omission and misidentification, improving the detection efficiency and reworking efficiency.

The piezoelectric film is attached to the pressing plate 15, which can ensure that the piezoelectric film is in full contact with the insulating layer 32 on the surface, preventing the problems of excessively large error or high misjudgment probability.

The foregoing descriptions are merely optional embodiments of this application which are not intended to limit this application. Persons skilled in the art understand that this application may have various modifications and variations. Any modifications, equivalent replacements, improvements, and the like made without departing from the spirit and principle of this application shall fall within the scope of the claims of this application.

What is claimed is:

1. A detection apparatus, comprising:

a conductive film having N film regions, wherein any two of the film regions are insulated from each other, the conductive film is used to fit with an insulating layer of a target, and the target comprises a metal layer, the insulating layer covering the metal layer;

a signal generator configured to transmit a first electromagnetic signal to the conductive film; and a signal receiver comprising N collecting units, wherein a n-th film region corresponds to a n-th collecting unit, and the signal receiver is configured to obtain a n-th collecting signal from a second electromagnetic signal generated after the first electromagnetic signal undergoes actions of the conductive film, the insulating layer, and the metal layer; wherein n is a positive integer less than or equal to N;

wherein the signal receiver is configured to use the n-th collecting signal to determine whether there is a predetermined defect in a region of the insulating layer covered by the n-th film region; and to use position information of the n-th film region to determine position information of the predetermined defect on the insulating layer.

2. The detection apparatus according to claim 1, wherein the detection apparatus further comprises a processing unit, wherein the processing unit is connected to the signal receiver, and the processing unit is configured to determine, based on the n-th collecting signal, whether there is the predetermined defect in the region of the insulating layer covered by the n-th film region.

3. The detection apparatus according to claim 2, wherein the processing unit is specifically configured to: determine, based on the n-th collecting signal, thickness of the region of the insulating layer covered by the n-th film region and determine whether the thickness is within a predetermined thickness range; and when the thickness is outside the predetermined thickness range, determine that there is the predetermined defect in the region of the insulating layer covered by the n-th film region; or when the thickness is within the predetermined thickness range, determine that there is no predetermined defect in the region of the insulating layer covered by the n-th film region.

4. The detection apparatus according to claim 2, wherein the processing unit is specifically configured to compare the n-th collecting signal with a predetermined signal; and when a difference between the n-th collecting signal and the predetermined signal is within a predetermined difference range, determine that there is no predetermined defect in the region of the insulating layer covered by the n-th film region; or when a difference between the n-th collecting signal and the predetermined signal is outside a predetermined difference range, determine that there is the predetermined defect in the region of the insulating layer covered by the n-th film region.

5. The detection apparatus according to claim 2, further comprising:

a communication unit configured to output the position information of the n-th film region as the position information of the predetermined defect on the insulating layer when the processing unit determines that there is the predetermined defect in the region of the insulating layer covered by the n-th film region.

6. The detection apparatus according to claim 1, further comprising:

a pressing plate, wherein the conductive film is disposed on the pressing plate.

7. The detection apparatus according to claim 6, wherein the n-th collecting unit is located between the pressing plate and the n-th film region.

8. The detection apparatus according to claim 6, wherein the n-th collecting unit is located on the n-th film region and electrically isolated from the n-th film region.

9. The detection apparatus according to claim 6, wherein the pressing plate has an alignment mechanism, wherein the alignment mechanism is configured to align the conductive film with a predetermined position of the target.

10. The detection apparatus according to claim 9, wherein:

the alignment mechanism comprises alignment markers located on the pressing plate, wherein the alignment markers are used to align with the predetermined position of the target; or the alignment mechanism comprises a backing plate located on the pressing plate, wherein the backing plate is located on a side surface of the conductive film, and the backing plate is configured to rest against the predetermined position of the target.

11. The detection apparatus according to claim 1, wherein:

the signal generator is a common signal generator, wherein the common signal generator is configured to transmit the first electromagnetic signal to the N film regions; or the n-th film region corresponds to the n-th signal generator, wherein the n-th signal generator is configured to transmit the first electromagnetic signal to the n-th film region.

12. The detection apparatus according to claim 1, wherein the target comprises a cell housing or a battery housing, wherein the cell housing or the battery housing comprises a metal housing and an insulating layer covering a surface of the metal housing.

13. A target detection and repair system, comprising:

the detection apparatus according to claim 1; and a repair apparatus connected to the detection apparatus, wherein the repair apparatus is configured to receive the position information of the predetermined defect on the insulating layer of the target output by the detection apparatus, and eliminate the predetermined defect based on the position information.

14. The system according to claim 13, wherein the repair apparatus comprises a dispensing apparatus, wherein the dispensing apparatus is configured to patch the insulating layer with adhesive based on the position information of the predetermined defect.

* * * * *